(12) United States Patent
Borchers et al.

(10) Patent No.: US 8,239,729 B2
(45) Date of Patent: Aug. 7, 2012

(54) DATA STORAGE DEVICE WITH COPY COMMAND

(75) Inventors: Albert T. Borchers, Santa Cruz, CA (US); Andrew T. Swing, Los Gatos, CA (US); Robert S. Sprinkle, San Jose, CA (US); Jason W. Klaus, Brooklyn, NY (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/269,183

(22) Filed: Oct. 7, 2011

(65) Prior Publication Data

US 2012/0030542 A1     Feb. 2, 2012

Related U.S. Application Data

(63) Continuation of application No. 12/756,007, filed on Apr. 7, 2010.

(60) Provisional application No. 61/167,709, filed on Apr. 8, 2009, provisional application No. 61/187,835, filed on Jun. 17, 2009, provisional application No. 61/304,469, filed on Feb. 14, 2010, provisional application No. 61/304,468, filed on Feb. 14, 2010, provisional application No. 61/304,475, filed on Feb. 14, 2010.

(51) Int. Cl.
*H03M 13/00* (2006.01)
*G11C 29/00* (2006.01)

(52) U.S. Cl. ........................................ 714/758; 714/763

(58) Field of Classification Search .................. 714/758, 714/763; 710/13, 31–33, 243; 711/162, 711/165
See application file for complete search history.

(56) References Cited

U.S. PATENT DOCUMENTS

| | | | |
|---|---|---|---|
| 4,449,182 A | | 5/1984 | Rubinson et al. |
| 4,777,595 A | | 10/1988 | Strecker et al. |
| 5,619,687 A | | 4/1997 | Langan et al. |
| 5,708,814 A | | 1/1998 | Short et al. |
| 5,802,345 A | | 9/1998 | Matsunami et al. |
| 5,844,776 A | | 12/1998 | Yamaguchi et al. |
| 5,941,998 A | | 8/1999 | Tillson |
| 6,003,112 A | * | 12/1999 | Tetrick ............................ 711/100 |

(Continued)

FOREIGN PATENT DOCUMENTS

EP     1736885 A2     12/2006

(Continued)

OTHER PUBLICATIONS

Wen Su; Ling Wang; Menghao Su; Su Liu; , "A Processor-DMA-Based Memory Copy Hardware Accelerator," Networking, Architecture and Storage (NAS), 2011 6th IEEE International Conference on, vol., No., pp. 225-229, Jul. 28-30, 2011.*

(Continued)

*Primary Examiner* — Cynthia Britt
(74) *Attorney, Agent, or Firm* — Brake Hughes Bellermann LLP

(57) ABSTRACT

A data storage device includes an interface that is configured to interface with a host, a command bus, multiple memory devices that are operably coupled to the command bus and a controller that is operably coupled to the interface and to the command bus. The controller is configured to receive a copy command from the host using the interface, read data from a source memory device in response to the copy command, write the data to a destination memory device in response to the copy command and communicate results to the host using the interface.

18 Claims, 10 Drawing Sheets

U.S. PATENT DOCUMENTS

| | | | |
|---|---|---|---|
| 6,009,478 A | 12/1999 | Panner et al. | |
| 6,167,338 A | 12/2000 | De Wille et al. | |
| 6,343,660 B1 | 2/2002 | Mutsears | |
| 6,640,290 B1 | 10/2003 | Forin et al. | |
| 6,678,463 B1 | 1/2004 | Pierre et al. | |
| 6,697,284 B2 | 2/2004 | Marotta | |
| 6,757,797 B1* | 6/2004 | Kaiya et al. | 711/162 |
| 6,854,022 B1 | 2/2005 | Thelin | |
| 6,868,007 B2* | 3/2005 | Hasegawa et al. | 365/185.09 |
| 6,938,188 B1* | 8/2005 | Kelleher | 714/43 |
| 6,982,919 B2 | 1/2006 | Kumhara et al. | |
| 7,000,245 B1 | 2/2006 | Pierre et al. | |
| 7,012,632 B2 | 3/2006 | Freeman et al. | |
| 7,028,137 B2 | 4/2006 | Nashimoto et al. | |
| 7,080,245 B2 | 7/2006 | Ballard et al. | |
| 7,080,377 B2 | 7/2006 | Peled et al. | |
| 7,088,387 B1 | 8/2006 | Freeman et al. | |
| 7,114,051 B2 | 9/2006 | Guu et al. | |
| 7,127,549 B2 | 10/2006 | Sinclair | |
| 7,127,551 B2 | 10/2006 | Beck | |
| 7,158,167 B1 | 1/2007 | Yerazunis et al. | |
| 7,159,104 B2 | 1/2007 | Dewey | |
| 7,161,834 B2 | 1/2007 | Kumahara et al. | |
| 7,225,289 B2 | 5/2007 | Tee et al. | |
| 7,296,213 B2 | 11/2007 | Vainsencher et al. | |
| 7,310,699 B2 | 12/2007 | Sinclair | |
| 7,328,304 B2 | 2/2008 | Royer, Jr. et al. | |
| 7,356,637 B2 | 4/2008 | Tee et al. | |
| 7,370,230 B1* | 5/2008 | Flake | 714/10 |
| 7,392,367 B2 | 6/2008 | Clark et al. | |
| 7,406,572 B1 | 7/2008 | Nguyen | |
| 7,546,393 B2 | 6/2009 | Day et al. | |
| 7,562,366 B2 | 7/2009 | Pope et al. | |
| 7,631,084 B2 | 12/2009 | Thomas et al. | |
| 7,660,306 B1 | 2/2010 | Eriksson et al. | |
| 7,668,177 B1 | 2/2010 | Trapp et al. | |
| 7,730,257 B2 | 6/2010 | Franklin | |
| 7,836,378 B2 | 11/2010 | Shaeffer et al. | |
| 7,865,809 B1 | 1/2011 | Lee et al. | |
| 7,904,639 B2* | 3/2011 | Kim et al. | 711/103 |
| 8,037,234 B2 | 10/2011 | Yu et al. | |
| 8,051,253 B2 | 11/2011 | Okin et al. | |
| 8,086,936 B2 | 12/2011 | Gower et al. | |
| 2001/0023472 A1 | 9/2001 | Kubushiro et al. | |
| 2002/0005895 A1 | 1/2002 | Freeman et al. | |
| 2002/0053004 A1 | 5/2002 | Pong | |
| 2002/0078285 A1 | 6/2002 | Hofstee et al. | |
| 2002/0178307 A1 | 11/2002 | Pua et al. | |
| 2003/0058689 A1 | 3/2003 | Marotta | |
| 2003/0101327 A1 | 5/2003 | Beck | |
| 2003/0117846 A1 | 6/2003 | Hasegawa et al. | |
| 2003/0208771 A1 | 11/2003 | Hensgen et al. | |
| 2003/0221092 A1 | 11/2003 | Ballard et al. | |
| 2003/0225960 A1 | 12/2003 | Guu et al. | |
| 2004/0049649 A1* | 3/2004 | Durrant | 711/165 |
| 2004/0078729 A1 | 4/2004 | Peter | |
| 2004/0236933 A1 | 11/2004 | Dewey | |
| 2005/0041509 A1 | 2/2005 | Kumahara et al. | |
| 2005/0160218 A1 | 7/2005 | See et al. | |
| 2005/0172067 A1 | 8/2005 | Sinclair | |
| 2005/0172087 A1* | 8/2005 | Klingman | 711/154 |
| 2005/0177698 A1 | 8/2005 | Ku et al. | |
| 2005/0193164 A1 | 9/2005 | Royer et al. | |
| 2006/0053308 A1 | 3/2006 | Zimmerman | |
| 2006/0062052 A1 | 3/2006 | Kumahara et al. | |
| 2006/0123284 A1 | 6/2006 | Hwang et al. | |
| 2006/0206653 A1 | 9/2006 | Tee et al. | |
| 2007/0008801 A1 | 1/2007 | Chiang et al. | |
| 2007/0028040 A1 | 2/2007 | Sinclair | |
| 2007/0101238 A1 | 5/2007 | Resnick et al. | |
| 2007/0113150 A1 | 5/2007 | Resnick et al. | |
| 2007/0198796 A1 | 8/2007 | Warren, Jr. | |
| 2007/0208900 A1 | 9/2007 | Tee et al. | |
| 2007/0255890 A1 | 11/2007 | Urata et al. | |
| 2007/0255981 A1 | 11/2007 | Eto et al. | |
| 2007/0288686 A1 | 12/2007 | Arcedera et al. | |
| 2007/0288692 A1 | 12/2007 | Bruce et al. | |
| 2008/0010431 A1 | 1/2008 | Chang et al. | |
| 2008/0022186 A1 | 1/2008 | Co et al. | |
| 2008/0040531 A1 | 2/2008 | Anderson | |
| 2008/0052448 A1 | 2/2008 | Minz et al. | |
| 2008/0052449 A1 | 2/2008 | Kim et al. | |
| 2008/0052451 A1 | 2/2008 | Pua et al. | |
| 2008/0059747 A1 | 3/2008 | Burckart et al. | |
| 2008/0065815 A1 | 3/2008 | Nasu et al. | |
| 2008/0077727 A1 | 3/2008 | Baca et al. | |
| 2008/0126658 A1 | 5/2008 | Wang | |
| 2008/0147931 A1 | 6/2008 | McDaniel et al. | |
| 2008/0155160 A1 | 6/2008 | McDaniel | |
| 2008/0163030 A1 | 7/2008 | Lee | |
| 2008/0178025 A1 | 7/2008 | Hand et al. | |
| 2008/0209157 A1 | 8/2008 | Weng | |
| 2008/0222491 A1 | 9/2008 | Lee et al. | |
| 2008/0235467 A1 | 9/2008 | Tagawa | |
| 2008/0288814 A1 | 11/2008 | Kitahara | |
| 2008/0294814 A1 | 11/2008 | Gorobets | |
| 2008/0301349 A1 | 12/2008 | Bacha | |
| 2008/0301381 A1 | 12/2008 | Lee et al. | |
| 2008/0320214 A1 | 12/2008 | Ma et al. | |
| 2009/0006720 A1 | 1/2009 | Traister | |
| 2009/0037652 A1 | 2/2009 | Yu et al. | |
| 2009/0044078 A1 | 2/2009 | Vogan et al. | |
| 2009/0055590 A1* | 2/2009 | Takahashi | 711/119 |
| 2009/0063895 A1 | 3/2009 | Smith | |
| 2009/0063922 A1 | 3/2009 | Gower et al. | |
| 2009/0063934 A1 | 3/2009 | Jo | |
| 2009/0119443 A1 | 5/2009 | Tremaine | |
| 2009/0125785 A1 | 5/2009 | Gorobets et al. | |
| 2009/0125790 A1 | 5/2009 | Iyer et al. | |
| 2009/0240873 A1 | 9/2009 | Yu et al. | |
| 2009/0265513 A1 | 10/2009 | Ryu | |
| 2010/0049914 A1 | 2/2010 | Goodwin | |
| 2010/0153660 A1 | 6/2010 | Lasser et al. | |
| 2010/0211737 A1 | 8/2010 | Flynn et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0287217 A1 | 11/2010 | Borchers et al. | |
| 2011/0191554 A1* | 8/2011 | Sakai et al. | 711/162 |
| 2011/0213921 A1 | 9/2011 | Yu et al. | |
| 2011/0238885 A1* | 9/2011 | Kitahara et al. | 711/103 |
| 2012/0030416 A1 | 2/2012 | Borchers et al. | |
| 2012/0030507 A1 | 2/2012 | Borchers et al. | |

FOREIGN PATENT DOCUMENTS

| | | |
|---|---|---|
| JP | 2004-071033 | 3/2004 |
| WO | 01/33852 A1 | 5/2001 |
| WO | 01/90900 A1 | 11/2001 |
| WO | 02/03388 A2 | 1/2002 |
| WO | 02/11424 A2 | 2/2002 |
| WO | 02/058383 A1 | 7/2002 |
| WO | 2005/081097 A2 | 9/2005 |
| WO | 2005/093588 A2 | 10/2005 |
| WO | 2005/081097 A3 | 11/2005 |
| WO | 2005/093588 A3 | 12/2006 |
| WO | 2007/072313 A2 | 6/2007 |
| WO | 2007/072317 A2 | 6/2007 |
| WO | 2007/072317 A3 | 6/2007 |
| WO | 2007/096844 A2 | 8/2007 |
| WO | 2007/096884 A3 | 8/2007 |
| WO | 2007/146756 A2 | 12/2007 |
| WO | 2007/146845 A2 | 12/2007 |
| WO | 2008/022094 A2 | 2/2008 |
| WO | 2008/040028 A2 | 4/2008 |
| WO | 2008/025238 A1 | 6/2008 |

| | | |
|---|---|---|
| WO | 2008/147752 A1 | 12/2008 |
| WO | 2010/117877 A1 | 10/2010 |
| WO | 2010/117878 A1 | 10/2010 |

OTHER PUBLICATIONS

International Search Report and Written Opinion received for PCT Application No. PCT/US2010/029677, mailed on Jul. 5, 2010, 13 pages.
International Search Report and Written Opinion received for PCT Application No. PCT/US2010/029679, mailed on Jul. 5, 2010, 20 pages.
International Search Report and Written Opinion received for PCT Application No. PCT/US2010/029916, mailed on Jul. 7, 2010, 14 pages.
International Search Report and Written Opinion received for PCT Application No. PCT/US2010/029917, mailed on Jul. 28, 2010, 19 pages.
International Search Report and Written Opinion received for PCT Application No. PCT/US2010/029919, mailed on Jul. 28, 2010, 11 pages.
International Search Report and Written Opinion received for PCT Application No. PCT/US 2010/030389, mailed on Jul. 21, 2010, 11 pages.
U.S. Appl. No. 12/537,733, filed Aug. 7, 2009.
U.S. Appl. No. 12/537,727, filed Aug. 7, 2009.
U.S. Appl. No. 12/537,725, filed Aug. 7, 2009.
U.S. Appl. No. 12/537,722, filed Aug. 7, 2009.
U.S. Appl. No. 12/537,719, filed Aug. 7, 2009.
U.S. Appl. No. 12/756,009, filed Apr. 7, 2010, 35 pages.
U.S. Appl. No. 12/537,709, filed Aug. 7, 2009.
U.S. Appl. No. 12/755,968, filed Apr. 7, 2010, 41 pages.
U.S. Appl. No. 12/755,964, filed Apr. 7, 2010, 44 pages.
U.S. Appl. No. 12/537,748, filed Aug. 7, 2009.
U.S. Appl. No. 12/756,007, filed Apr. 7. 2010, 54 pages.
U.S. Appl. No. 12/756,477, filed Apr. 8, 2010, 51 pages.
U.S. Appl. No. 12/537,738, filed Aug. 7, 2009.
Non Final Office Action for U.S. Appl. No. 12/537,727, mailed on Dec. 13, 2010, 20 pages.
Non-Final Office Action for U.S. Appl. No. 12/537,727, mailed on Jun. 3, 2011, 15 pages.
Non-Final Office Action Response for U.S. Appl. No. 12/537,727, filed Mar. 14, 2011, 11 pages.
Non-Final Office Action for U.S. Appl. No. 12/755,968, mailed Jan. 26, 2012, 32 pages.
Non-Final Office Action for U.S. Appl. No. 13/269,985, mailed Jan. 6, 2012, 24 pages.
Non-Final Office Action for U.S. Appl. No. 12/537,709, mailed Dec. 19, 2011, 28 pages.
Non-Final Office Action for U.S. Appl. No. 12/537,719, mailed Nov. 30, 2011, 29 pages.
Non-Final Office Action for U.S. Appl. No. 12/537,722, mailed Dec. 29, 2011, 25 pages.
Non-Final Office Action for U.S. Appl. No. 12/537,704, mailed Nov. 28, 2011, 24 pages.
Non-Final Office Action for U.S. Appl. No. 12/537,748, mailed Dec. 12, 2011, 24 pages.
Non-Final Office Action for U.S. Appl. No. 12/537,741, mailed Dec. 21, 2011, 25 pages.
Non-Final Office Action for U.S. Appl. No. 12/537,738, mailed Dec. 12, 2011, 25 pages.
Non-Final Office Action for U.S. Appl. No. 12/537,725, mailed Jan. 30, 2012, 33 pages.
Non-Final Office Action for U.S. Appl. No. 13/269,972, mailed Jan. 5, 2012, 26 pages.
Non-Final Office Action Response for U.S. Appl. No. 12/537,704, filed Feb. 28, 2012, 25 pages.
Non-Final Office Action Response for U.S. Appl. No. 12/537,709, filed Mar. 19, 2012, 25 pages.
Paris, et al, "Evaluating the Impact of Irrecoverable Read Errors on Disk Array Reliability", 15th IEEE Pacific Rim International Symposium on Dependable Computing, Nov. 16-18, 2009, 6 pages.
Takeuchi, "Novel Co-Design of NAND Flash Memory and NAND Flash Controller Circuits for Sub-30 nm Low-Power High-Speed Solid-State Drives (SSD)", IEEE Journal of Solid-State Circuits, vol. 44, No. 4, Apr. 2009, pp. 1227-1234.
Non-Final Office Action Response for U.S. Appl. No. 12/537,719, filed Feb. 29, 2012, 23 pages.
Non-Final Office Action Response for U.S. Appl. No. 12/537,727, filed Aug. 31, 2011, 15 pages.
Non-Final Office Action for U.S. Appl. No. 12/537,727, mailed Nov. 8, 2011, 13 pages.
Non-Final Office Action Response for U.S. Appl. No. 12/537,727, filed Mar. 8, 2012, 22 pages.
Non-Final Office Action for U.S. Appl. No. 12/537,733, mailed Mar. 14, 2012, 23 pages.
Notice of Allowance for U.S. Appl. No. 12/537,722, mailed May 11, 2012, 14 pages.
Notice of Allowance for U.S. Appl. No. 13/269,972, mailed May 23, 2012, 18 pages.
Non-Final Office Action for U.S. Appl. No. 13/269,985, mailed Jun. 6, 2012, 19 pages.
Non-Final Office Action Response for U.S. Appl. No. 12/537,722, filed Apr. 19, 2012, 12 pages.
Non-Final Office Action Response for U.S. Appl. No. 12/537,725, filed Apr. 27, 2012, 12 pages.
Non-Final Office Action Response for U.S. Appl. No. 12/537,748, filed May 2, 2012, 13 pages.
Notice of Allowance for U.S. Appl. No. 12/537,725, mailed May 21, 2012, 18 pages.
Final Office Action for U.S. Appl. No. 12/537,704, mailed Apr. 6, 2012, 15 pages.
Notice of Allowance for U.S. Appl. No. 12/537,709, mailed Apr. 6, 2012, 14 pages.
Non-Final Office Action Response for U.S. Appl. No. 13/269,972, filed Apr. 4, 2012, 12 pages.
Final Office Action for U.S. Application No. 12/537,719, mailed Apr. 9, 2012, 21 pages.
Non-Final Office Action Response for U.S. Appl. No. 13/269,985, filed Apr. 4, 2012, 15 pages.
Notice of Allowance for U.S. Appl. No. 12/537,727, mailed Apr. 24, 2012, 14 pages.

* cited by examiner

DATA STORAGE DEVICE WITH COPY COMMAND

CROSS REFERENCE TO RELATED APPLICATIONS

This application is a continuation of U.S. application Ser. No. 12/756,007, filed Apr. 7, 2010, and titled "Data Storage Device," which claims the benefit of U.S. Provisional Application No. 61/167,709, filed Apr. 8, 2009, and titled "Data Storage Device", U.S. Provisional Application No. 61/187,835, filed Jun. 17, 2009, and titled "Partitioning and Striping in a Flash Memory Data Storage Device," U.S. Provisional Application No. 61/304,469, filed Feb. 14, 2010, and titled "Data Storage Device," U.S. Provisional Patent Application No. 61/304,468, filed Feb. 14, 2010, and titled "Data Storage Device," and U.S. Provisional Patent Application No. 61/304,475, filed Feb. 14, 2010, and titled "Data Storage Device," all of which are hereby incorporated by reference in entirety.

TECHNICAL FIELD

This description relates to a data storage device and managing multiple memory chips on the data storage device.

BACKGROUND

Data storage devices may be used to store data. A data storage device may be used with a computing device to provide for the data storage needs of the computing device. In certain instances, it may be desirable to store large amounts of data on a data storage device. Also, it may be desirable to execute commands quickly to read data and to write data to the data storage device.

The throughput of the command execution on the data storage device may be related to the number of commands that may be processed by the data storage device. It may be desirable to achieve a high throughput for the data storage device by increasing the number of commands that may be processed by the data storage device.

Furthermore, it may be desirable to execute commands received from a host on the data storage device while minimizing the processing impact and overhead on the host and the data storage device.

SUMMARY

This document describes a data storage device that includes one or more memory boards, where each of the memory boards includes multiple memory chips. The data storage device includes a controller board to which the memory boards operably connect. The data storage device may be configured to communicate with a host using an interface to receive commands from the host and to process those commands using the memory chips. For example, the host may send and the controller board may receive commands to read, write, copy and erase blocks of data using the memory chips. Throughout this document memory chips and memory devices are used interchangeably to mean the same thing.

In one exemplary implementation, the host may communicate a read metadata command to a controller on the controller board using the interface. The read metadata command causes the controller to read metadata from one or more of the memory devices. The metadata obtained from the memory devices is communicated to the host and the host uses the metadata to generate a table to correlate physical addresses for data with logical sector numbers. In this manner, the both a driver on the host and firmware on the controller perform functions to enable the ultimate generation of the table for storage on the host. The read metadata command may be used at power up of the memory devices and also may be used as a part of the garbage collection process. The controller may process multiple read metadata commands in parallel.

In another exemplary implementation, the host may communicate a bad block scan command to the controller on the controller board using the interface. The bad block scan command causes the controller to scan a memory device for bad blocks that are not usable for storing data. The controller may generate a map of the bad blocks for the scanned memory device and may communicate the map to the host. In this manner, the host stores the map and participates in bad block management of the memory devices. The controller may process multiple bad block scan commands in parallel.

In another exemplary implementation, the host may communicate a copy command to the controller on the controller board using the interface. In one implementation, the copy command may be used to read data from one location on a memory device and write the data to another location on the same memory device. In this manner, a single copy command may be issued from the host instead of a read command and a write command. The single copy command may be executed on the controller without any intermediate steps involving the host. The copy command may be used as part of the garbage collection process. In another implementation, the copy command may be used to read data from a location on one memory device and to write the data to a location on a different memory device. The controller may process multiple copy commands in parallel.

In another exemplary implementation, the copy command may read the data from one location on the memory device and, at the same time the data is being read, perform error correction on the data. Thus, error correction is performed as the as the data is being streamed from the memory location. Any bits in the data that require correcting are corrected and then the corrected data is written to the other location with re-generated error correction code data.

In another exemplary implementation, the host may communicate a verify on write command to the controller on the controller board using the interface. The verify on write command causes the controller to write data to a memory device and then use error correction codes to verify that the data written to the memory device is correct without having to read the data back to the host to determine that the data was written correctly. In this manner, the controller writes the data to the memory device and reads the data within the controller to check for errors and then reports the results back to the host. The controller may be configured to read the just written data and calculate the error correction codes as the data is being read without having to buffer the data. The controller may process multiple verify on write commands in parallel.

In one exemplary implementation, the controller includes a field-programmable gate array (FPGA) controller and the interface between the host and the controller board may be a high speed interface such as, for example, a peripheral component interconnect express (PCIe) interface. In this manner, the data storage device may include high storage volumes and may be configured to achieve high performance and high speeds of data transfer between the host and the memory chips.

In one exemplary implementation, the data storage device may be configured with two memory boards with each of the memory boards including multiple memory chips. The data storage device, including the controller board and two memory boards, may be configured in a disk drive form such that the data storage device fits in an on-board drive slot of a computing device. For instance, the data storage device may be configured to fit in an on-board drive slot of a server to provide data storage capacity for the server. The data storage device may be configured to be removable such that it may be removed easily from the computing device and inserted in the on-board drive slot of a different computing device. In one exemplary implementation, the data storage device may include multiple channel controllers that are arranged and configured to control operations associated with one or more memory chips.

In one exemplary implementation, the memory chips may include flash memory chips. In other exemplary implementations, each of the memory boards may include memory devices other than flash memory chips. For example, each of the memory boards may include multiple dynamic random access memory (DRAM) chips. In other exemplary implementations, the memory boards may include other types of memory devices including, for example, phase change memory (PCM) chips and other types of memory devices.

In another exemplary implementation, the controller on the controller board may be configured to recognize and to operate with one type of memory device on the one memory board and, at the same time, operate with a different type of memory device on the other memory board. For example, one of the memory boards may include flash memory chips and another memory board may include DRAM chips.

According to one general aspect, data storage device may include an interface that is arranged and configured to interface with a host, a command bus, multiple memory devices that are operably coupled to the command bus and a controller that is operably coupled to the interface and to the command bus. The controller may be arranged and configured to receive a read metadata command for a specified one of the memory devices from the host using the interface, read metadata from the specified memory device and communicate the metadata to the host using the interface.

Implementations may include one or more of the following features. For example, the metadata may include a logical sector number and a generation number. The generation number may indicate a version of data associated with the logical sector number. The metadata may include an error correction code. When the read metadata command returns an error, the controller or the driver may be arranged and configured to re-read the metadata from the specified memory device multiple times, combine the metadata into a single metadata result and communicate the single metadata result to the host using the interface. The controller may be arranged and configured to read the metadata from multiple pages of the specified memory device with a single read metadata command and communicate the metadata from the multiple pages to the host using the interface. The controller may be further arranged and configured to receive multiple read metadata commands for multiple different specified memory devices from the host using the interface, read metadata from the specified memory devices in parallel and communicate the metadata to the host using the interface.

In another general aspect, a recordable storage medium having recorded and stored thereon instructions that, when executed, may perform the actions of receiving a read metadata command for a specified memory device of multiple memory devices from a host using an interface, reading metadata from the specified memory device and communicating the metadata to the host using the interface. Implementations may include one or more of the features described above and/or below.

In another general aspect, a recordable storage medium having recorded and stored thereon instructions that, when executed, may perform the actions of communicating a read metadata command to a controller using an interface to read metadata from a specified memory device of multiple memory devices, receiving the metadata from the controller using the interface and generating a table to map a physical address of data stored in the specified memory device to a logical address for the data using the metadata. Implementations may include one or more of the features described above and/or below.

In another general aspect, a data storage device may include an interface that is arranged and configured to interface with a host, a command bus, multiple memory devices that are operably coupled to the command bus and a controller that is operably coupled to the interface and to the command bus. The controller may be arranged and configured to receive a bad block scan command for a specified one of the memory devices from the host using the interface, scan the specified memory device for bad blocks, generate a map of the bad blocks and communicate the map to the host using the interface.

Implementations may include one or more of the following features. The map may include a bitmap. The controller may be configured to scan the specified memory device by scanning for a pattern written to the memory device by a manufacturer to determine the bad blocks. The controller may be further arranged and configured to receive multiple bad block scan commands for multiple different specified memory devices from the host using the interface, scan the specified memory devices for bad blocks in parallel, generate a map of bad blocks for each of the memory devices and communicate the maps to the host using the interface.

In another general aspect, a recordable storage medium having recorded and stored thereon instructions that, when executed, may perform the actions of receiving a bad block scan command for a specified memory device of multiple memory devices from a host using an interface, scanning the specified memory device for bad blocks, generating a map of the bad blocks and communicating the map to the host using the interface. Implementations may include one or more of the features described above and/or below.

In another general aspect, a recordable storage medium having recorded and stored thereon instructions that, when executed, may perform the actions of communicating a bad block scan command to a controller using an interface to scan a specified memory device of multiple memory devices for bad blocks, receiving a map of the bad blocks from the controller using the interface and storing the map of the bad blocks. Implementations may include one or more of the features described above and/or below.

In another general aspect, a data storage device may include an interface that is arranged and configured to interface with a host, a command bus, multiple memory devices that are operably coupled to the command bus and a controller that is operably coupled to the interface and to the command bus. The controller may be arranged and configured to receive a copy command from the host using the interface, read data from a source memory device in response to the copy command, write the data to a destination memory device in response to the copy command and communicate results to the host using the interface.

Implementations may include one or more of the following features. For example, the source memory device and the destination memory device may be a same memory device. The source memory device and the destination memory device may be different memory devices. The controller may include multiple channel controllers, where each channel controller is arranged and configured to control one or more of the memory devices and the source memory device and the destination memory device may be controlled by a same channel controller. The controller may include multiple channel controllers, where each channel controller is arranged and configured to control one or more of the memory devices and the source memory device and the destination memory device may be controlled by different channel controllers. The controller may be further configured to read metadata from the source memory device and write the metadata to the destination memory device. The controller may be further configured to check for errors in data on the source memory device when reading the data from the source memory device, correct the errors in the data, generate new error correction codes for the corrected data and write the corrected data and the new error correction codes to the destination memory device.

In another general aspect, a recordable storage medium having recorded and stored thereon instructions that, when executed, may perform the actions of receiving, at a controller that is arranged and configured to control multiple memory devices, a copy command from a host using an interface, reading data from a source memory device in response to the copy command, writing the data to a destination memory device in response to the copy command and communicating results to the host using the interface. Implementations may include one or more of the features described above and/or below.

In another general aspect, a method may include receiving, at a controller that is arranged and configured to control multiple memory devices, a copy command from a host using an interface, reading data from a source memory device in response to the copy command, writing the data to a destination memory device in response to the copy command and communicating results to the host using the interface. Implementations may include one or more of the features described above and/or below.

In another general aspect, a data storage device may include an interface that is arranged and configured to interface with a host, a command bus, multiple memory devices that are operably coupled to the command bus and a controller that is operably coupled to the interface and to the command bus. The controller may be arranged and configured to receive a verify on write command from the host using the interface, write data to one of the memory devices, read the data from the memory device, calculate an error correction code for the data as the data is being read, verify the data was written correctly to the memory device using the error correction code and communicate results to the host using the interface.

Implementations may include one or more of the following features. For example, the controller may be arranged and configured to calculate the error correction code without using a buffer.

In another general aspect, a recordable storage medium having recorded and stored thereon instructions that, when executed, may perform the actions of receiving, at a controller that is arranged and configured to control multiple memory devices, a verify on write command from a host using an interface, writing data to one of the memory devices, reading the data from the memory device, calculating an error correction code for the data as the data is being read, verifying the data was written correctly to the memory device using the error correction code and communicating results to the host using the interface.

Implementations may include one or more of the following features. For example, the instructions that, when executed, may perform the action of calculating the error correction code without using a buffer.

In another general aspect, a method may include receiving, at a controller that is arranged and configured to control multiple memory devices, a verify on write command from a host using an interface, writing data to one of the memory devices, reading the data from the memory device, calculating an error correction code for the data as the data is being read, verifying the data was written correctly to the memory device using the error correction code and communicating results to the host using the interface.

Implementations may include one or more of the following features. For example, calculating the error correction code may include calculating the error correction code without using a buffer.

The details of one or more implementations are set forth in the accompanying drawings and the description below. Other features will be apparent from the description and drawings, and from the claims.

BRIEF DESCRIPTION OF THE DRAWINGS

Like reference numerals may refer to the same component throughout the figures.

DETAILED DESCRIPTION

This document describes an apparatus, system(s) and techniques for data storage. Such a data storage apparatus may include a controller board having a controller that may be used with one or more different memory boards, with each of the memory boards having multiple memory devices. The memory devices may include flash memory chips, DRAM chips, PCM chips and other type of memory chips. The data storage apparatus may communicate with a host using an interface on the controller board. In this manner, the controller on the controller board may be configured to receive commands from the host using the interface and to execute those commands using the flash memory chips on the memory boards.

This document also describes various different commands that may be communicated by the host to the controller on the controller board. These commands may include, for example, a metadata command, a bad block scan command, a copy command and a verify on write command. In this manner, these commands are made known to the host and initiated by the host to be performed, at least in part, by the controller on the controller board. The controller may be configured to process multiple commands in parallel.

Figure 1:
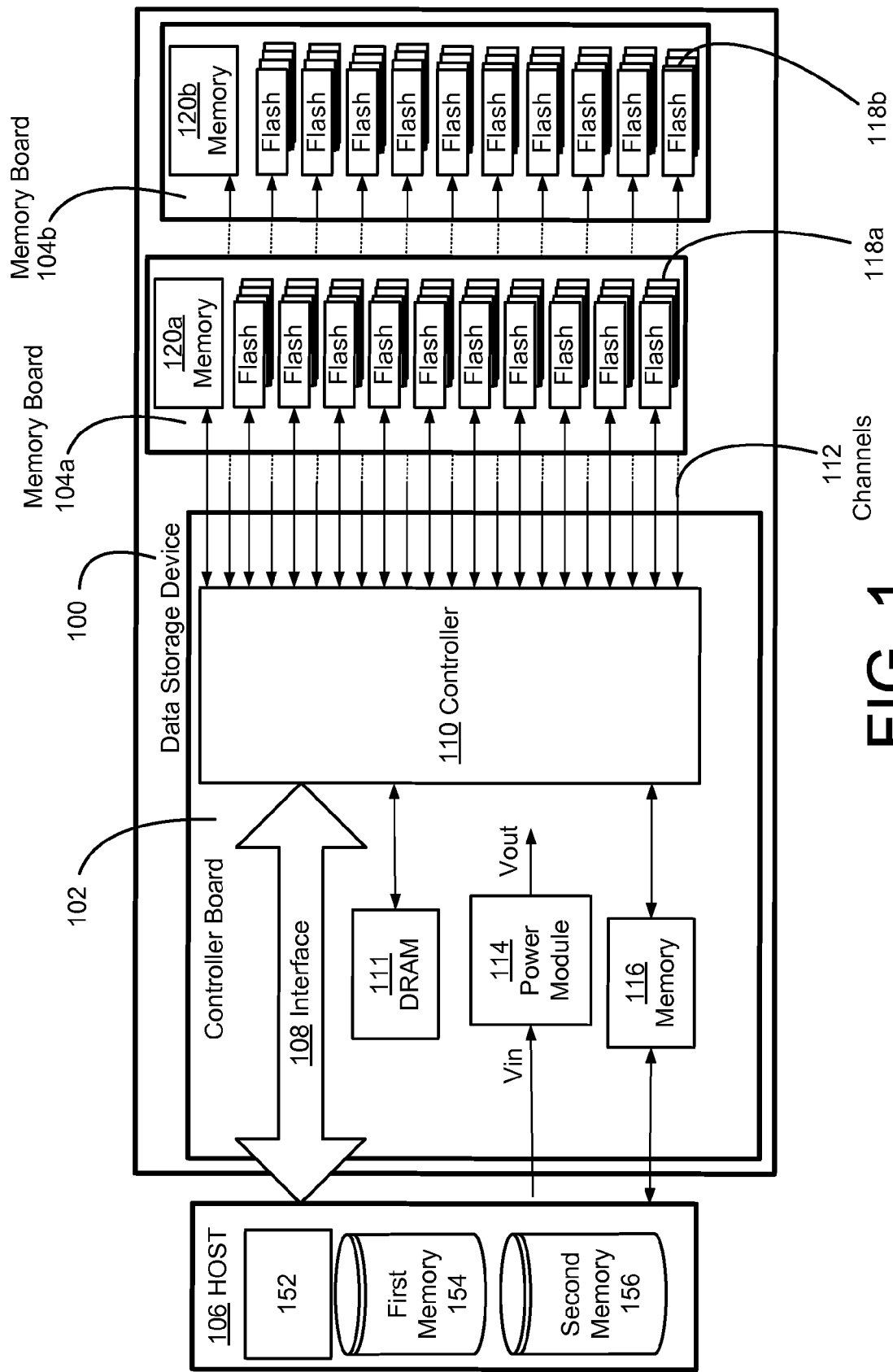
FIG. 1 is an exemplary block diagram of a data storage device.

FIG. 1 is a block diagram of a data storage device 100. The data storage device 100 may include a controller board 102 and one or more memory boards 104a and 104b. The data storage device 100 may communicate with a host 106 over an interface 108. The interface 108 may be between the host 106 and the controller board 102. The controller board 102 may include a controller 110, a DRAM 111, multiple channels 112, a power module 114, and a memory module 116. The memory boards 104a and 104b may include multiple memory devices on each of the memory boards. In this exemplary figure, multiple flash memory chips 118a and 118b are illustrated on each of the memory boards; however, as discussed above, other types of memory chips may be used including, for example, DRAM chips, PCM chips and other types of memory chips. The memory boards 104a and 104b also may include a memory device 120a and 120b.

In general, the data storage device 100 may be configured to store data on the flash memory chips 118a and 118b. The host 106 may write data to and read data from the flash memory chips 118a and 118b, as well as cause other operations to be performed with respect to the flash memory chips 118a and 118b. The reading and writing of data between the host 106 and the flash memory chips 118a and 118b, as well as the other operations, may be processed through and controlled by the controller 110 on the controller board 102. The controller 110 may receive commands from the host 106 and cause those commands to be executed using the flash memory chips 118a and 118b on the memory boards 104a and 104b. The communication between the host 106 and the controller 110 may be through the interface 108. The controller 110 may communicate with the flash memory chips 118a and 118b using the channels 112.

The controller board 102 may include DRAM 111. The DRAM 111 may be operably coupled to the controller 110 and may be used to store information. For example, the DRAM 111 may be used to store logical address to physical address maps and bad block information. The DRAM 111 also may be configured to function as a buffer between the host 106 and the flash memory chips 118a and 118b.

The host can include, for example, a processor 152, a first memory 154, a second memory 156, and a partition engine 160. The first memory 154 can include, for example, a non-volatile memory device (e.g., a hard disk) adapted for storing machine-readable, executable code instructions that can be executed by the processor 152. The code instructions stored on the first memory 154 can be loaded into the second memory (e.g., a volatile memory, such as, a random access memory) 156 where they can be executed by the processor 152. The second memory can include logical blocks of "user space" devoted to user mode applications and logical blocks of "kernel space" devoted to running the lower-level resources that user-level applications must control to perform their functions. The second memory may be configured to store one or more tables including a logical to physical memory map, so that user-level application programs can use logical addresses that then are mapped to physical memory addresses of the flash memory chips of the storage device 100. The second memory also may be configured a physical memory to logical map.

In one exemplary implementation, the controller board 102 and each of the memory boards 104a and 104b are physically separate printed circuit boards (PCBs). The memory board 104a may be on one PCB that is operably connected to the controller board 102 PCB. For example, the memory board 104a may be physically and/or electrically connected to the controller board 102. Similarly, the memory board 104b may be a separate PCB from the memory board 104a and may be operably connected to the controller board 102 PCB. For example, the memory board 104b may be physically and/or electrically connected to the controller board 102.

The memory boards 104a and 104b each may be separately disconnected and removable from the controller board 102. For example, the memory board 104a may be disconnected from the controller board 102 and replaced with another memory board (not shown), where the other memory board is operably connected to controller board 102. In this example, either or both of the memory boards 104a and 104b may be swapped out with other memory boards such that the other memory boards may operate with the same controller board 102 and controller 110.

In one exemplary implementation, the controller board 102 and each of the memory boards 104a and 104b may be physically connected in a disk drive form factor. The disk drive form factor may include different sizes such as, for example, a 3.5" disk drive form factor and a 2.5" disk drive form factor.

In one exemplary implementation, the controller board 102 and each of the memory board 104a and 104b may be electrically connected using a high density ball grid array (BGA) connector. Other variants of BGA connectors may be used including, for example, a fine ball grid array (FBGA) connector, an ultra fine ball grid array (UBGA) connector and a micro ball grid array (MBGA) connector. Other types of electrical connection means also may be used.

Figure 2:
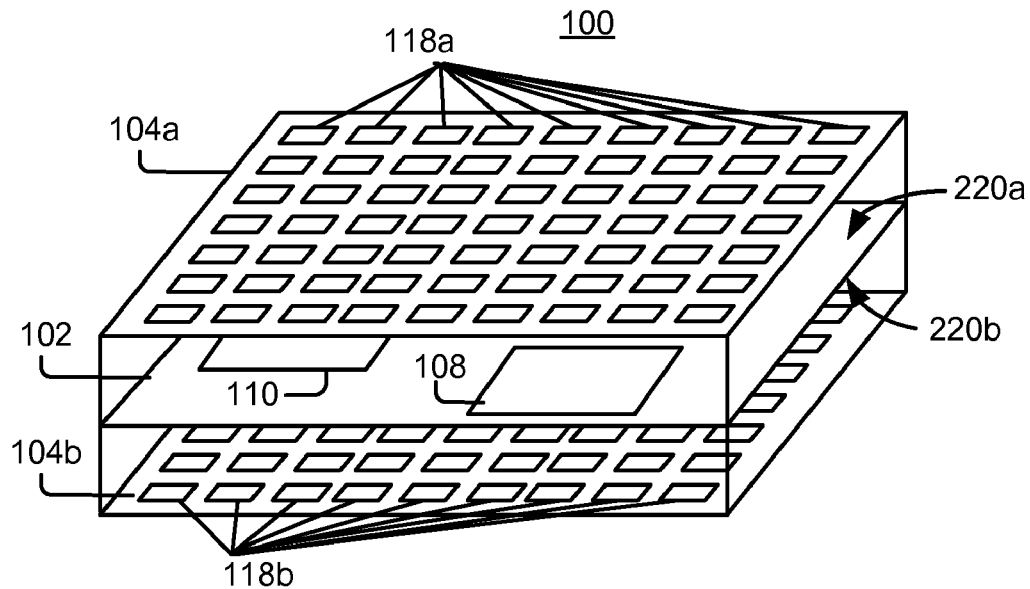
FIG. 2 is an exemplary perspective block diagram of the printed circuit boards of the data storage device.

In one exemplary implementation, the controller board 102, which is its own PCB, may be located physically between each of the memory boards 104a and 104b, which are on their own separate PCBs. Referring also to FIG. 2, the data storage device 100 may include the memory board 104a on one PCB, the controller board 102 on a second PCB, and the memory board 104b on a third PCB. The memory board 104a includes multiple flash memory chips 118a and the memory board 104b includes multiple flash memory chips 118b. The controller board 102 includes the controller 110 and the interface 108 to the host (not shown), as well as other components (not shown).

In the example illustrated by FIG. 2, the memory board 104a may be operably connected to the controller board 102 and located on one side 220a of the controller board 102. For instance, the memory board 104a may be connected to a top side 220a of the controller board 102. The memory board 104b may be operably connected to the controller board 102 and located on a second side 220b of the controller board 102. For instance, the memory board 104b may be connected to a bottom side 220b of the controller board 102.

Other physical and/or electrical connection arrangements between the memory boards 104a and 104b and the controller board 102 are possible. FIG. 2 merely illustrates one exemplary arrangement. For example, the data storage device 100 may include more than two memory board such as three memory boards, four memory boards or more memory boards, where all of the memory boards are connected to a single controller board. In this manner, the data storage device may still be configured in a disk drive form factor. Also, the memory boards may be connected to the controller board in other arrangements such as, for instance, the controller board on the top and the memory cards on the bottom or the controller board on the bottom and the memory cards on the top.

Figure 3:
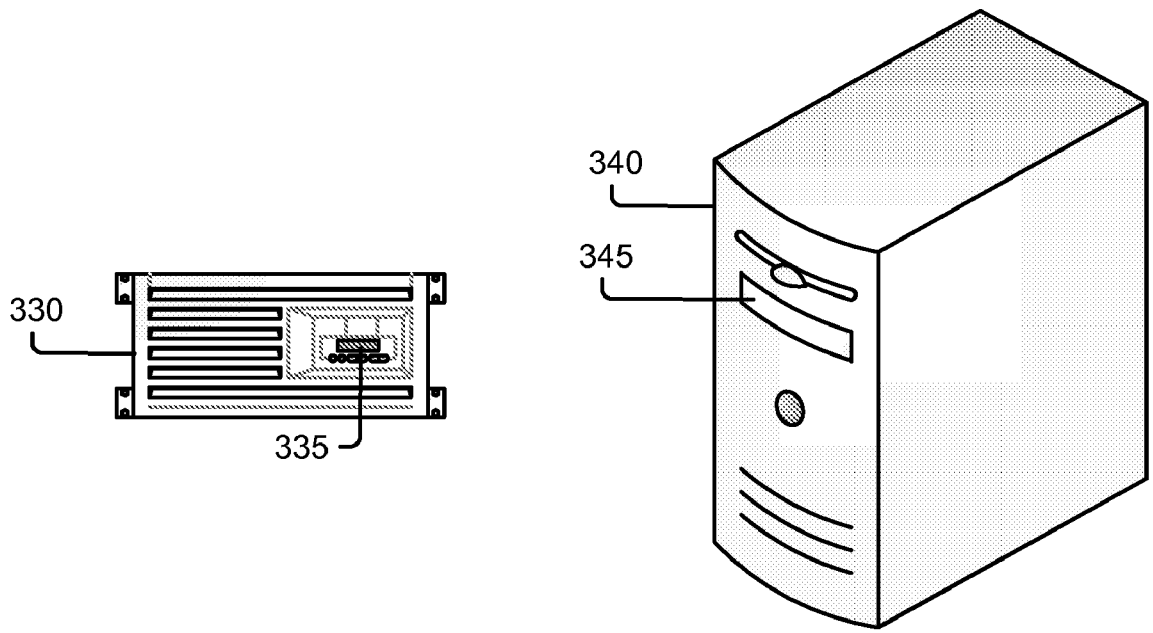
FIG. 3 is an exemplary block diagram of exemplary computing devices for use with the data storage device of FIG. 1.

The data storage device 100 may be arranged and configured to cooperate with a computing device. In one exemplary implementation, the controller board 102 and the memory boards 104a and 104b may be arranged and configured to fit within a drive bay of a computing device. Referring to FIG. 3, two exemplary computing devices are illustrated, namely a server 330 and a server 340. The servers 330 and 340 may be arranged and configured to provide various different types of computing services. The servers 330 and 340 may include a host (e.g., host 106 of FIG. 1) that includes computer program products having instructions that cause one or more processors in the servers 330 and 340 to provide computing services. The type of server may be dependent on one or more application programs that are operating on the server. For instance, the servers 330 and 340 may be application servers, web servers, email servers, search servers, streaming media servers, e-commerce servers, file transfer protocol (FTP) servers, other types of servers or combinations of these servers. The server 330 may be configured to be a rack-mounted server that operates within a server rack. The server 340 may be configured to be a stand-alone server that operates independent of a server rack. Even though the server 340 is not within a server rack, it may be configured to operate with other servers and may be operably connected to other servers. Servers 330 and 340 are meant to illustrate example computing devices. Other computing devices, including other types of servers, may be used.

In one exemplary implementation, the data storage device 100 of FIGS. 1 and 2 may be sized to fit within a drive bay 335 of the server 330 of the drive bay 345 of the server 340 to provide data storage functionality for the servers 330 and 340. For instance, the data storage device 100 may be sized to a 3.5" disk drive form factor to fit in the drive bays 335 and 345. The data storage device 100 also may be configured to other sizes. The data storage device 100 may operably connect and communicate with the servers 330 and 340 using the interface 108. In this manner, the host may communicate commands to the controller board 102 using the interface 108 and the controller 110 may execute the commands using the flash memory chips 118a and 118b on the memory boards 104a and 104b.

Referring back to FIG. 1, the interface 108 may include a high speed interface between the controller 110 and the host 106. The high speed interface may enable for fast transfers of data between the host 106 and the flash memory chips 118a and 118b. In one exemplary implementation, the high speed interface may include a PCIe interface. For instance, the PCIe interface may be a PCIe x4 interface or a PCIe x8 interface. The PCIe interface 108 may include a PCIe connector cable assembly to the host 106. Other high speed interfaces, connectors and connector assemblies also may be used.

In one exemplary implementation, the communication between the controller board 102 and the flash memory chips 118a and 118b on the memory boards 104a and 104b may be arranged and configured into multiple channels 112. Each of the channels 112 may communicate with one or more flash memory chips 118a and 118b. The controller 110 may be configured such that commands received from the host 106 may be executed by the controller 110 using each of the channels 112 simultaneously or at least substantially simultaneously. In this manner, multiple commands may be executed simultaneously on different channels 112, which may improve throughput of the data storage device 100.

In the example of FIG. 1, twenty (20) channels 112 are illustrated. The completely solid lines illustrate the ten (10) channels between the controller 110 and the flash memory chips 118a on the memory board 104a. The mixed solid and dashed lines illustrate the ten (10) channels between the controller 110 and the flash memory chips 118b on the memory board 104b. As illustrated in FIG. 1, each of the channels 112 may support multiple flash memory chips. For instance, each of the channels 112 may support up to 32 flash memory chips. In one exemplary implementation, each of the 20 channels may be configured to support and communicate with 6 flash memory chips. In this example, each of the memory boards 104a and 104b would include 60 flash memory chips each. Depending on the type and the number of the flash memory chips 118a and 118b, the data storage 100 device may be configured to store up to and including multiple terabytes of data.

The controller 110 may include a microcontroller, a FPGA controller, other types of controllers, or combinations of these controllers. In one exemplary implementation, the controller 110 is a microcontroller. The microcontroller may be implemented in hardware, software, or a combination of hardware and software. For example, the microcontroller may be loaded with a computer program product from memory (e.g., memory module 116) including instructions that, when executed, may cause the microcontroller to perform in a certain manner. The microcontroller may be configured to receive commands from the host 106 using the interface 108 and to execute the commands. For instance, the commands may include commands to read, write, copy and erase blocks of data using the flash memory chips 118a and 118b, as well as other commands.

In another exemplary implementation, the controller 110 is a FPGA controller. The FPGA controller may be implemented in hardware, software, or a combination of hardware and software. For example, the FPGA controller may be loaded with firmware from memory (e.g., memory module 116) including instructions that, when executed, may cause the FPGA controller to perform in a certain manner. The FPGA controller may be configured to receive commands from the host 106 using the interface 108 and to execute the commands. For instance, the commands may include commands to read, write, copy and erase blocks of data using the flash memory chips 118a and 118b, as well as other commands.

In one exemplary implementation, the FPGA controller may support multiple interfaces 108 with the host 106. For instance, the FPGA controller may be configured to support multiple PCIe x4 or PCIe x8 interfaces with the host 106.

The memory module 116 may be configured to store data, which may be loaded to the controller 110. For instance, the memory module 116 may be configured to store one or more images for the FPGA controller, where the images include firmware for use by the FPGA controller. The memory module 116 may interface with the host 106 to communicate with the host 106. The memory module 116 may interface directly with the host 106 and/or may interface indirectly with the host 106 through the controller 110. For example, the host 106 may communicate one or more images of firmware to the memory module 116 for storage. In one exemplary implementation, the memory module 116 includes an electrically erasable programmable read-only memory (EEPROM). The memory module 116 also may include other types of memory modules.

The power module 114 may be configured to receive power (Vin), to perform any conversions of the received power and to output an output power (Vout). The power module 114 may receive power (Vin) from the host 106 or from another source. The power module 114 may provide power (Vout) to the controller board 102 and the components on the controller board 102, including the controller 110. The power module 114 also may provide power (Vout) to the memory boards 104a and 104b and the components on the memory boards 104a and 104b, including the flash memory chips 118a and 118b.

In one exemplary implementation, the power module 114 may include one or more direct current (DC) to DC converters. The DC to DC converters may be configured to receive a power in (Vin) and to convert the power to one or more different voltage levels (Vout). For example, the power module 114 may be configured to receive +12 V (Vin) and to convert the power to 3.3 v, 1.2 v, or 1.8 v and to supply the power out (Vout) to the controller board 102 and to the memory boards 104a and 104b.

The memory boards 104a and 104b may be configured to handle different types of flash memory chips 118a and 118b. In one exemplary implementation, the flash memory chips 118a and the flash memory chips 118b may be the same type of flash memory chips including requiring the same voltage from the power module 114 and being from the same flash memory chip vendor. The terms vendor and manufacturer are used interchangeably throughout this document.

In another exemplary implementation, the flash memory chips 118a on the memory board 104a may be a different type of flash memory chip from the flash memory chips 118b on the memory board 104b. For example, the memory board 104a may include SLC NAND flash memory chips and the memory board 104b may include MLC NAND flash memory chips. In another example, the memory board 104a may include flash memory chips from one flash memory chip manufacturer and the memory board 104b may include flash memory chips from a different flash memory chip manufacturer. The flexibility to have all the same type of flash memory chips or to have different types of flash memory chips enables the data storage device 100 to be tailored to different applications being used by the host 106.

In another exemplary implementation, the memory boards 104a and 104b may include different types of flash memory chips on the same memory board. For example, the memory board 104a may include both SLC NAND chips and MLC NAND chips on the same PCB. Similarly, the memory board 104b may include both SLC NAND chips and MLC NAND chips. In this manner, the data storage device 100 may be advantageously tailored to meet the specifications of the host 106.

In another exemplary implementation, the memory board 104a and 104b may include other types of memory devices, including non-flash memory chips. For instance, the memory boards 104a and 104b may include random access memory (RAM) such as, for instance, dynamic RAM (DRAM) and static RAM (SRAM) as well as other types of RAM and other types of memory devices. In one exemplary implementation, the both of the memory boards 104a and 104b may include RAM. In another exemplary implementation, one of the memory boards may include RAM and the other memory board may include flash memory chips. Also, one of the memory boards may include both RAM and flash memory chips.

The memory modules 120a and 120b on the memory boards 104a and 104b may be used to store information related to the flash memory chips 118a and 118b, respectively. In one exemplary implementation, the memory modules 120a and 120b may store device characteristics of the flash memory chips. The device characteristics may include whether the chips are SLC chips or MLC chips, whether the chips are NAND or NOR chips, a number of chip selects, a number of blocks, a number of pages per block, a number of bytes per page and a speed of the chips.

In one exemplary implementation, the memory modules 120a and 120b may include serial EEPROMs. The EEPROMs may store the device characteristics. The device characteristics may be compiled once for any given type of flash memory chip and the appropriate EEPROM image may be generated with the device characteristics. When the memory boards 104a and 104b are operably connected to the controller board 102, then the device characteristics may be read from the EEPROMs such that the controller 110 may automatically recognize the types of flash memory chips 118a and 118b that the controller 110 is controlling. Additionally, the device characteristics may be used to configure the controller 110 to the appropriate parameters for the specific type or types of flash memory chips 118a and 118b.

Figure 4:
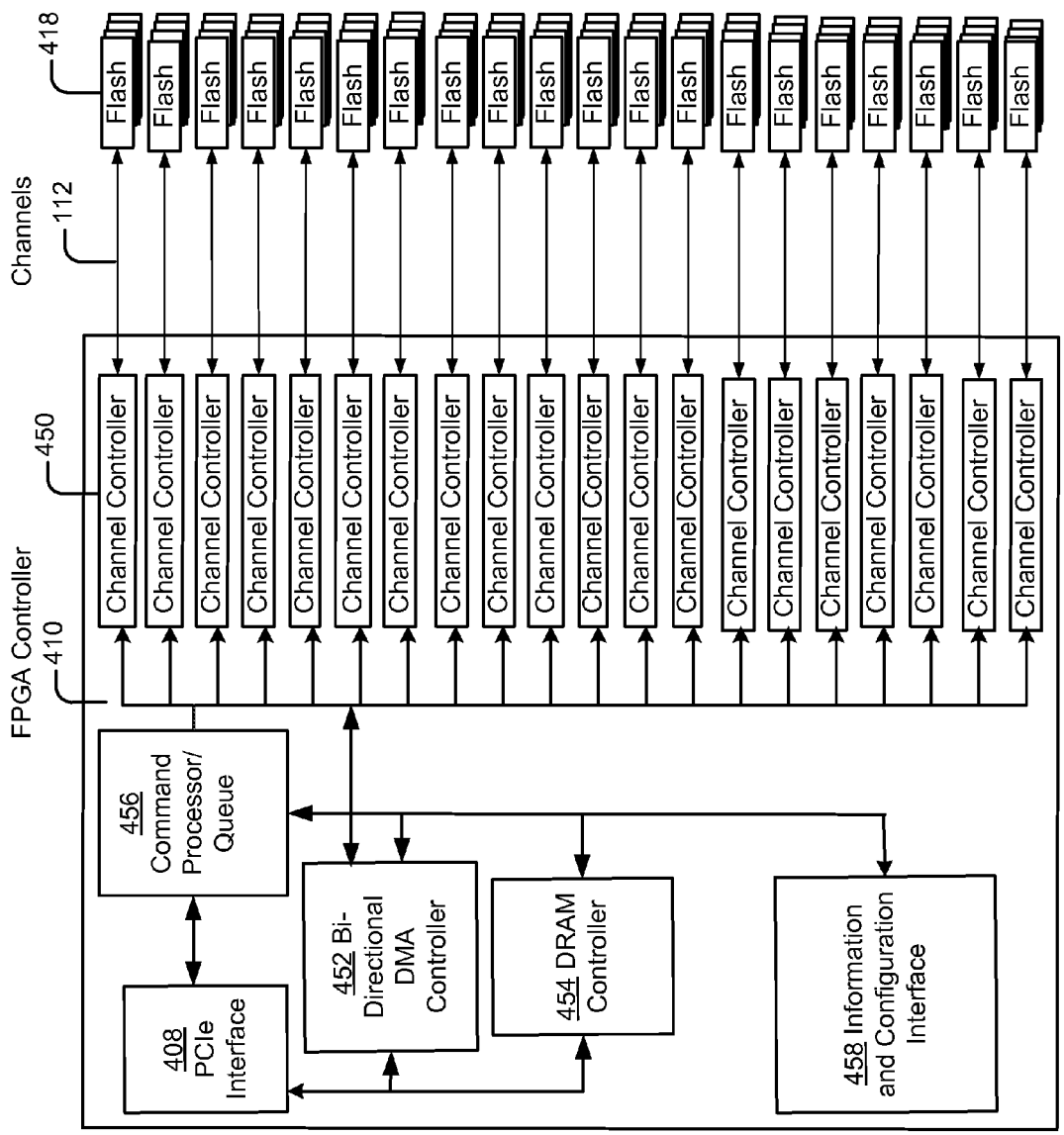
FIG. 4 is an exemplary block diagram of a controller.

As discussed above, the controller 110 may include a FPGA controller. Referring to FIG. 4, an exemplary block diagram of a FPGA controller 410 is illustrated. The FPGA controller may be configured to operate in the manner described above with respect to controller 110 of FIG. 1. The FPGA controller 410 may include multiple channel controllers 450 to connect the multiple channels 112 to the flash memory chips 418. The flash memory chips 418 are illustrated as multiple flash memory chips that connect to each of the channel controllers 450. The flash memory chips 418 are representative of the flash memory chips 118a and 118b of FIG. 1, which are on the separate memory boards 104a and 104b of FIG. 1. While illustrated in FIG. 4 as flash memory chips, the memory devices 418 may be other types of memory devices, as discussed above. The separate memory boards are not shown in the example of FIG. 4. The FPGA controller 410 may include a PCIe interface module 408, a bi-directional direct memory access (DMA) controller 452, a dynamic random access memory (DRAM) controller 454, a command processor/queue 456 and an information and configuration interface module 458.

Information may be communicated with a host (e.g., host 106 of FIG. 1) using an interface. In this example, FIG. 4, the FPGA controller 410 includes a PCIe interface to communicate with the host and a PCIe interface module 408. The PCIe interface module 408 may be arranged and configured to receive commands from the host and to send commands to the host. The PCIe interface module 408 may provide data flow control between the host and the data storage device. The PCIe interface module 408 may enable high speed transfers of data between the host and the controller 410 and ultimately the flash memory chips 418. In one exemplary implementation, the PCIe interface and the PCIe interface module 408 may include a 64-bit bus.

The bi-directional DMA controller 452 may be configured to interface with the PCIe interface 408, the command processor/queue 456 and each of the channel controllers 450. The bi-directional DMA controller 452 enables bi-directional direct memory access between the host and the flash memory chips 418.

The DRAM controller 454 may be arranged and configured to control the translation of logical to physical addresses. For example, the DRAM controller 454 may assist the command processor/queue 456 with the translation of the logical addresses used by the host and the actual physical addresses in the flash memory chips 418 related to data being written to or read from the flash memory chips 418. A logical address received from the host may be translated to a physical address for a location in one of the flash memory chips 418. Similarly, a physical address for a location in one of the flash memory chips 418 may be translated to a logical address and communicated to the host.

The command processor/queue 456 may be arranged and configured to receive the commands from the host through the PCIe interface module 408 and to control the execution of the commands through the channel controllers 450. The command processor/queue 456 may maintain a queue for a number of commands to be executed. In this manner, multiple commands may be executed simultaneously and each of the channels 112 may be used simultaneously or at least substantially simultaneously.

The command processor/queue 456 may be configured to process commands for different channels 112 out of order and preserve per-channel command ordering. For instance, commands that are received from the host and that are designated for different channels may be processed out of order by the command processor/queue 456. In this manner, the channels may be kept busy. Commands that are received from the host for processing on the same channel may be processed in the order that the commands were received from the host by the command processor/queue 456. In one exemplary implementation, the command processor/queue 456 may be configured to maintain a list of commands received from the host in an oldest-first sorted list to ensure timely execution of the commands.

The channel controllers 450 may be arranged and configured to process commands from the command processor/queue 456. Each of the channel controllers 450 may be configured to process commands for multiple flash memory chips 418. In one exemplary implementation, each of the channel controllers 450 may be configured to process commands for up to and including 32 flash memory chips 418.

The channel controllers 450 may be configured to process the commands from the command processor/queue 456 in order as designated by the command processor/queue 456. Examples of the commands that may be processed include, but are not limited to, reading a flash page, programming a flash page, copying a flash page, erasing a flash block, reading a flash block's metadata, mapping a flash memory chip's bad blocks, and resetting a flash memory chip.

The information and configuration interface module 458 may be arranged and configured to interface with a memory module (e.g., memory module 116 of FIG. 1) to receive configuration information for the FPGA controller 410. For example, the information and configuration interface module 458 may receive one or more images from the memory module to provide firmware to the FPGA controller 410. Modifications to the images and to the firmware may be provided by the host to the controller 410 through the information and configuration interface module 458. Modifications received through the information and configuration interface module 458 may be applied to any of the components of the controller 410 including, for example, the PCIe interface module 408, the bi-directional DMA controller 452, the DRAM controller 454, the command processor/queue 456 and the channel controllers 450. The information and configuration interface module 458 may include one or more registers, which may be modified as necessary by instructions from the host.

The FPGA controller 410 may be arranged and configured to cooperate and process commands in conjunction with the host. The FPGA controller 410 may perform or at least assist in performing error correction, bad block management, logical to physical mapping, garbage collection, wear leveling, partitioning and low level formatting related to the flash memory chips 418.

Figure 5:
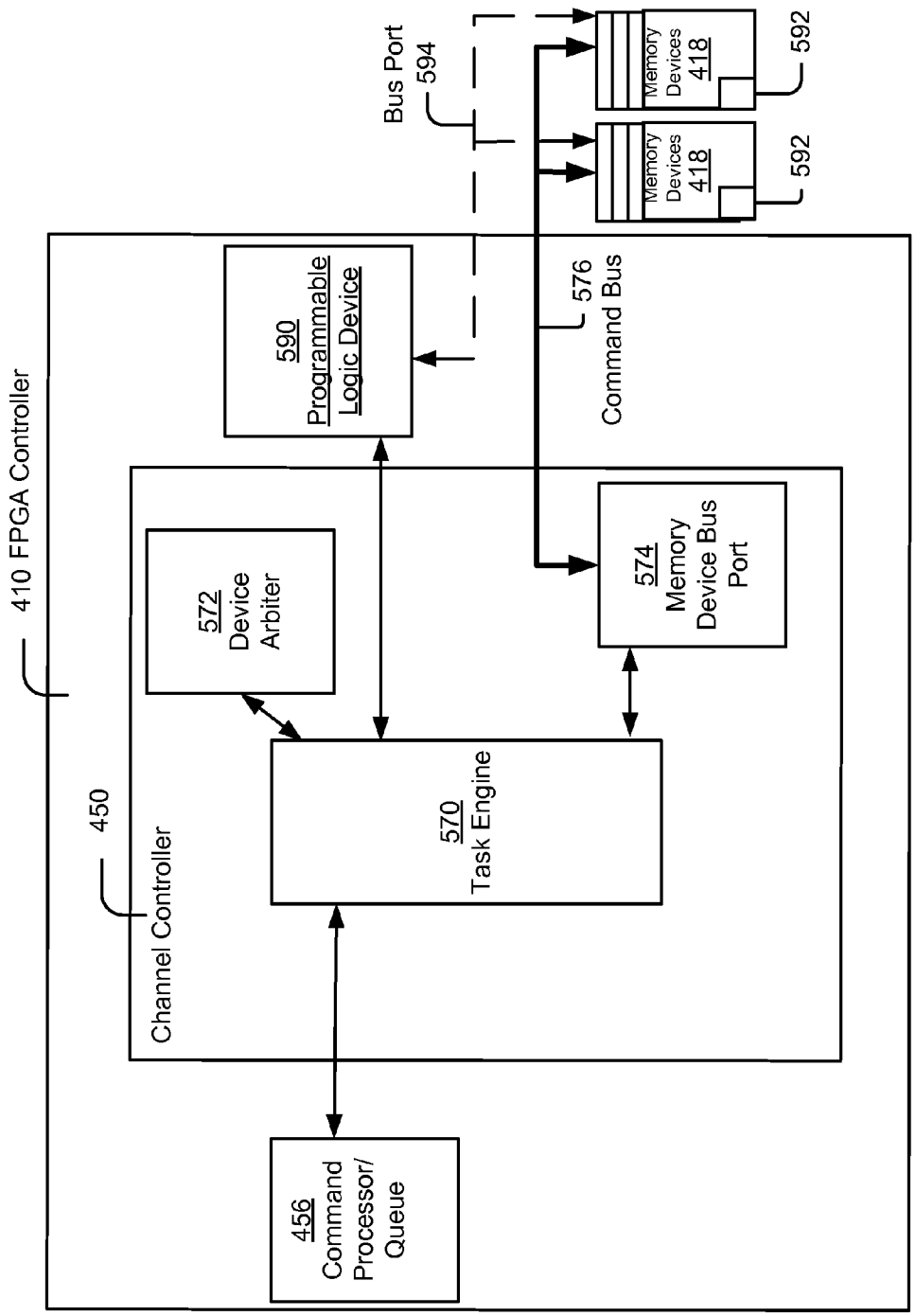
FIG. 5 is an exemplary block diagram of components related to a channel controller.

Referring to FIG. 5, an exemplary block diagram illustrates components related to one of the channel controllers 450. Although FIG. 5 illustrates a single channel controller 450, it is to be understood that each of the multiple channel controllers illustrated in FIG. 4 include the same components and connections. As discussed above, the channel controller 450 may be configured to control the operation of the memory devices 418. As illustrated in FIG. 5, the devices 418 are referred to as memory devices since they may be different types of memory devices including, for example, flash memory chips, DRAM chips, PCM chips and other types of memory chips. The channel controller 450 may be configured to control multiple memory devices. The channel controller 450 is a component on the controller board 410 and is operably coupled to command processor/queue 456. The channel controller 450 may be configured to receive commands from the command processor/queue 456 and to control the processing of the received commands by its associated memory devices 418. The channel controller 450 also may communicate to the command processor/queue 456 when commands have been processed by the memory devices 418.

In one exemplary implementation, the memory devices 418 may include flash memory chips, as discussed above. The channel controller 450 may be configured to process commands for performance by the flash memory chips including, for example, reading a flash page, programming a flash page, copying a flash page, erasing a flash page, reading a flash block's meta data, mapping a flash device's bad blocks and resetting a flash chip.

The channel controller 450 may include a task engine 570, a device arbiter 572, and a memory device bus port 574. The channel controller 450 may be operably coupled to the memory devices 418 using a command bus 576. The task engine 570 may be configured to enable multiple, simultaneous operations on the channel controlled by the channel controller 450. The task engine 570 enables high performance interleaving of commands to be executed by the multiple memory devices 418 associated with the channel.

In one exemplary implementation, the task engine 570 may include multiple task engines, where each of the task engines is an independent state machine that is configured to arbitrate the use of multiple shared resources. The task engine 570 may be configured to perform multi-threading of tasks using the shared resources. For example, one instance of the task engine 570 may perform an operation with one of the memory devices 418 and, at the same time, another instance of the task engine 570 may perform an operation to arbitrate the command bus 576 in conjunction with the device arbiter 572. The task engine 570 may be operably coupled to the command/queue processor 456 to coordinate the processing of commands received from the command processor/queue 456 using the memory devices 418.

The device arbiter 572 may be configured to assist the task engine 570 with the arbitrating the use of the memory devices 418. The task engine 570 may communicate with the memory devices 418 through the memory device bus port 574. The memory device bus port 574 may be configured to provide a physical interface between the channel controller 450 and the memory devices 418. As discussed above, the memory devices 418 may be on a memory board, which is separate from the controller board 410. The memory device bus port 574 may provide a physical interface between the controller board 410 and the memory board on which the memory devices 418 may be affixed.

The memory device bus port 574 may be operably coupled with the memory devices 418 using the command bus 576. The command bus 576 is operably coupled to each of the memory devices 418 that are associated with a particular channel controller 450. The commands received from the command processor/queue 456 that are designated for a particular memory device are processed using the command bus 576.

As discussed above, the commands may be initiated by the host for execution by the controller using a designated memory device. In one exemplary implementation, each command and its corresponding response may refer to a single page, a single erase block, a fraction of an erase block, a single memory device, or a fraction of a single memory device depending on the command. In one exemplary implementation, data that is communicated between the host and the memory devices may correspond to a hardware sector on the memory device. The hardware section may be, for instance, a sector of 4K bytes. Other sizes of hardware sectors also may be used.

Referring back to FIG. 1, in one exemplary implementation, the host 106 may communicate a read metadata command to the controller 110. The read metadata command causes the controller 110 to read the metadata from all or some fraction of the pages in an erase block at once. Also referring to FIG. 4, the channel controller 450 for the designated memory device 418 may execute the read metadata command. The metadata is read from the designated memory device and then the controller 110 communicates the metadata to the host 106.

In one exemplary implementation, the metadata may include a logical sector number and a generation number. The logical sector number refers to the logical number associated with the physical location of the data stored on the memory device. For example, when the application layer on the host reads or writes data on a memory device, the application layer refers to a logical sector number for the data. The driver on the host refers to a table stored in memory to convert the logical section number to a physical address for the data on the memory device. The driver sends the request to the controller using the physical address and the request is fulfilled.

The generation number is a counter that is incremented each time a sector is written. The generation number may be used to distinguish between different copies of the same data. For example, the first time a sector is written, the generation number may be 1000. The next time the same sector is written, the generation number may be 2000. The generation number may be configured to increment each time any sector number is written. The generation number is a mechanism to identify the most recent copy for a particular sector.

The metadata also may include an error correction code (ECC). The error correction code may be used to verify that the data was correctly written to the memory device when the data is read from the memory device. The results of any correction reported to the host may include information related to a number of bits of data that were corrected and also may include an uncorrectable error flag. The ECC for the metadata may be separate bits from any ECC bits related to the data payload.

The metadata may be stored in the memory device with the data when the data is written to the memory device. For example, when data is written one of the memory devices, the logical sector number, the generation number and the ECC may be stored along with the data in the memory device. The read metadata command may be used to read the metadata from the memory device and to communicate the information to the host.

The read metadata command may be used in various situations. For instance, when the driver on the host is first started, the read metadata command may be used to enable the host to obtain the logical sector number and generation numbers and to build the table of logical sector numbers to physical addresses. The host uses generation number to determine the correct physical address for a sector number that has been written multiple different times to the memory device. In this manner, the host knows where the most recent copy of the data for a logical sector number is stored. The read metadata command also may be used as part of the garbage collection process.

The read metadata command may read the metadata for a specified erase block. In one implementation, each erase block may include multiple pages of memory in the memory device. The single read metadata command may read the metadata from each of the pages in a given erase block. In this manner, the single read metadata command may return multiple metadata items that correspond to each page. For instance, if an erase block includes 64 pages, then a single read metadata command obtains the metadata from each of the 64 pages and the metadata for each of the 64 pages is communicated back to the host. Thus, multiple blocks of metadata may be read using a single command.

In one implementation, the host may communicate multiple read metadata commands to the controller and the controller may be configured to execute the read metadata commands in parallel. In this manner, multiple blocks of metadata across multiple memory devices may be read simultaneously. This may speed up processing for the host when the host is gathering the metadata to build the table of logical sectors to physical addresses. Each page of metadata may include its own error code. In this manner, the controller and the host may know specifically which page in a memory device may or may not contain errors.

In one implementation, if the read metadata command is executed successfully, then the metadata is communicated to the host. If the read metadata command is unsuccessful, then the host may attempt to execute the command multiple times. The host may combine the results from the multiple attempts.

In one implementation, the read metadata command may be used in the garbage collection process to determine the data being held by a particular block of memory. By obtaining the metadata, the host can build a table from individual page addresses to the sector number and store the result in memory.

Figure 6A:
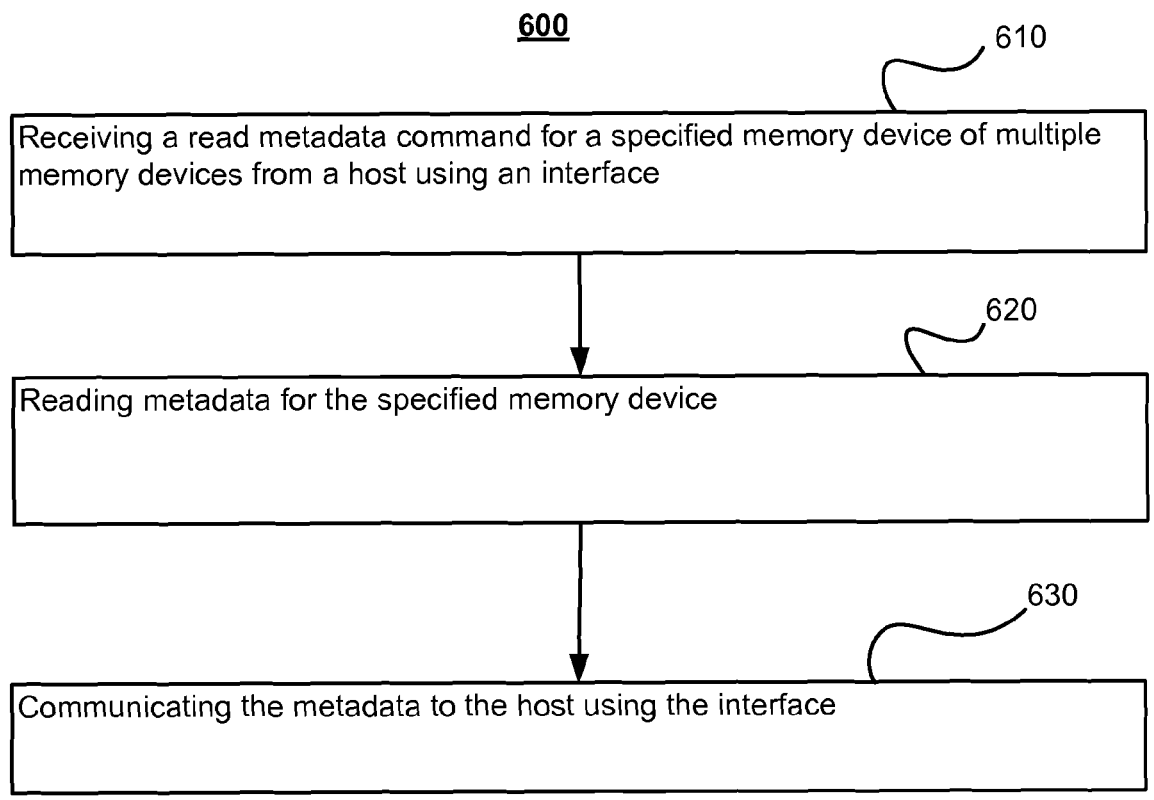
FIG. 6A is an exemplary flowchart illustrating example operations of the data storage device related to a read metadata command.

Referring to FIG. 6A, a process 600 is illustrated for a read metadata command as related to the data storage device. Process 600 may include receiving a read metadata command for a specified memory device out of multiple memory devices from a host using an interface (610), reading metadata for the specified memory device (620) and communicating the metadata to the host using the interface (630).

Figure 6B:
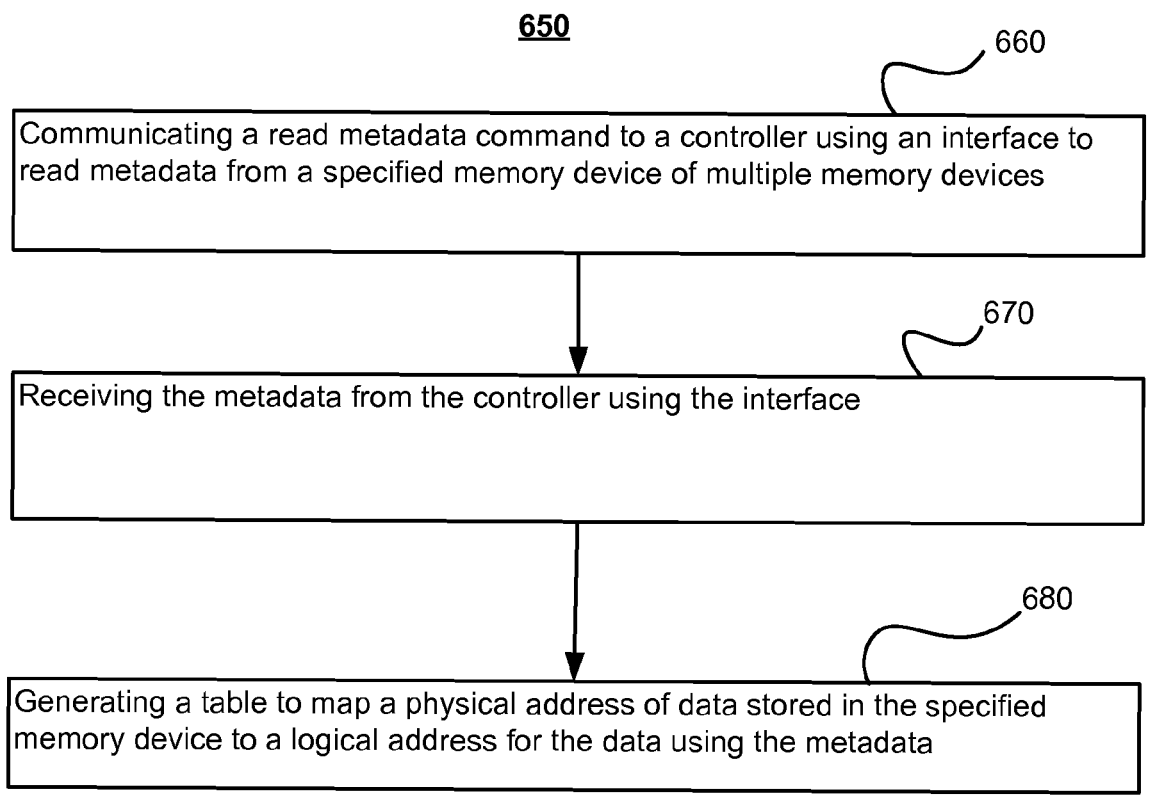
FIG. 6B is an exemplary flowchart illustrating example operations of the host related to a read metadata command.

Referring to FIG. 6B, a process 650 is illustrated for a read metadata command as related to the host. Process 650 may include communicating a read metadata command to a controller using an interface to read metadata from a specified memory device of multiple memory devices (660), receiving the metadata from the controller using the interface (670) and generating a table to map a physical address of data stored in the specified memory device to a logical address for the data using the metadata (680).

In another exemplary implementation, the host 106 may communicate a bad block scan command to the controller 110. The bad block scan command may cause the controller 110 to scan a designated memory device for bad blocks, where the bad blocks are blocks of memory that are not usable.

In one exemplary implementation, bad blocks may be uniquely marked to indicate that the block is bad. For example, the memory device manufacturer may mark blocks as bad using a unique pattern, which may be specific to the memory device manufacturer. The single command from the host may cause an entire memory device to be scanned for bad blocks. The scan for the bad blocks may include identifying a pattern written to the memory device by the manufacturer to identify the bad blocks.

The controller may be configured to generate a map of the bad blocks for the memory device. In one exemplary implementation, the controller may generate a bitmap of the memory device to indicate which blocks on the memory device are bad. The controller may communicate the map to the host and the host may store the map in memory.

Figure 7A:
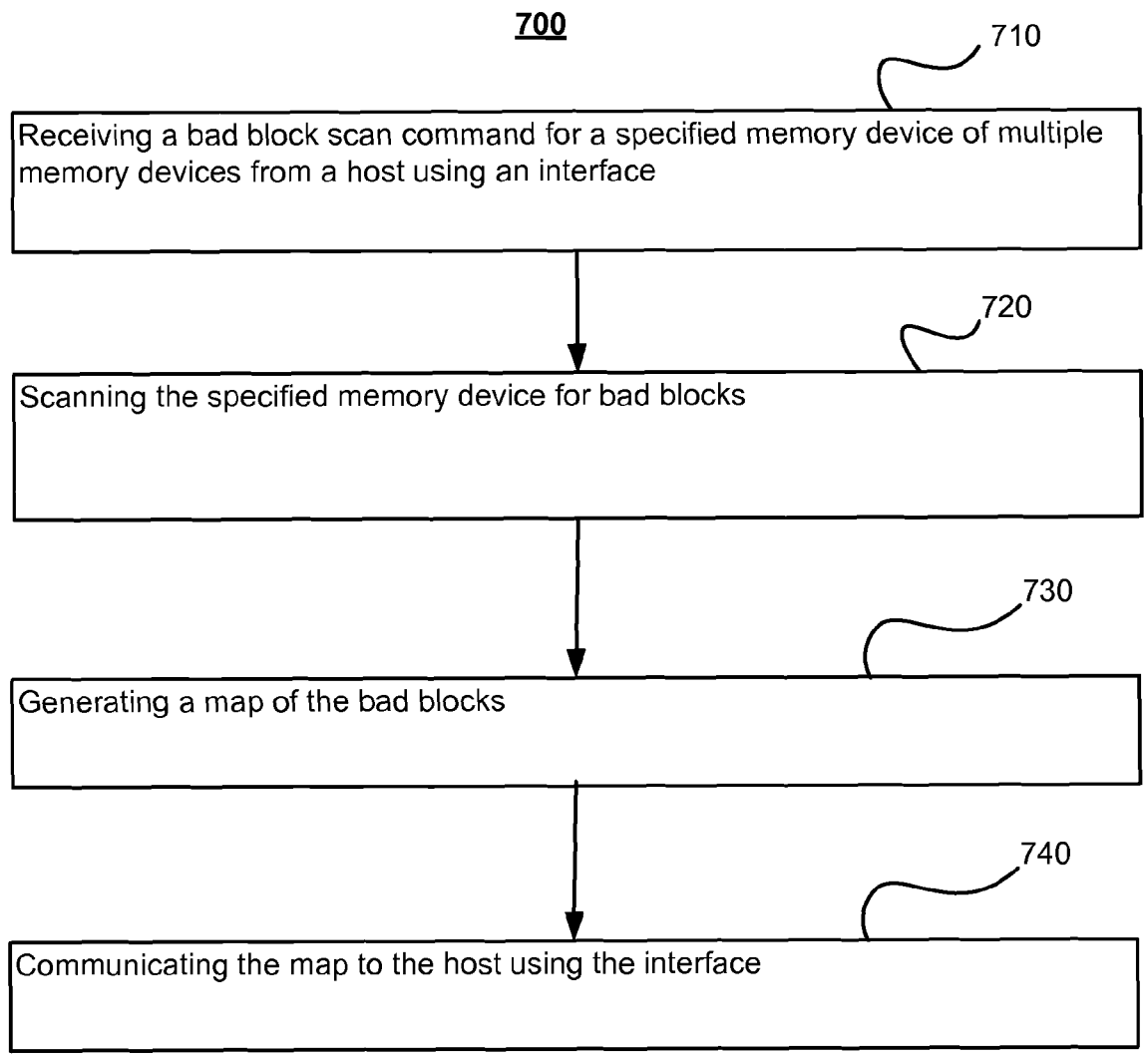
FIG. 7A is an exemplary flowchart illustrating example operations of the data storage device related to a bad block scan command.

Referring to FIG. 7A, a process 700 is illustrated for a bad block scan command as related to the data storage device. Process 700 may include receiving a bad block scan command for a specified memory device of multiple memory devices from a host using an interface (710), scanning the specified memory device for bad blocks (720), generating a map of the bad blocks (730) and communicating the map to the host using the interface (740).

Figure 7B:
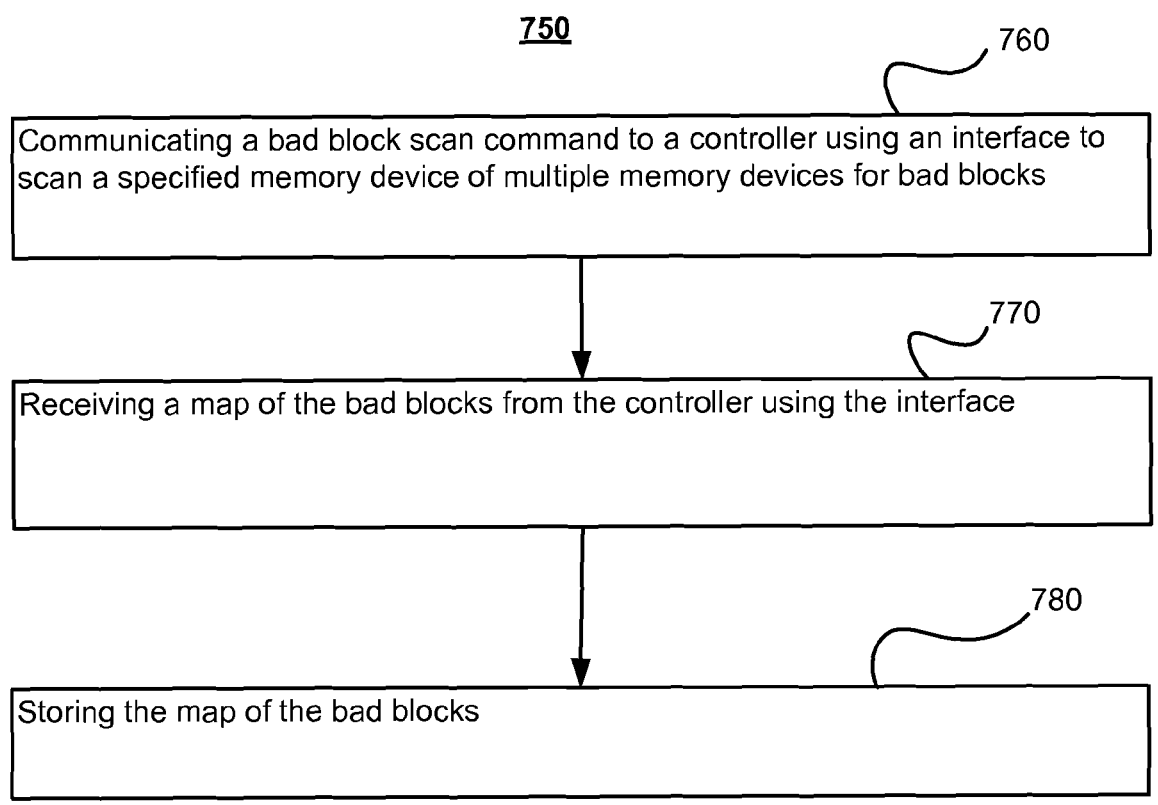
FIG. 7B is an exemplary flowchart illustrating example operations of the host related to a bad block scan command.

Referring to FIG. 7B, a process 750 is illustrated for a bad block scan command as related to the host. Process 750 may include communicating a bad block scan command to a controller using an interface to scan a specified memory device of multiple memory devices for bad blocks (760), receiving a map of the bad blocks from the controller using the interface (770) and storing the map of the bad blocks (780).

In another exemplary implementation, the host 106 may initiate a copy command and communicate the copy command to the controller 110. The copy command may be used to read data from a source memory device and to write the data to a destination memory device. In one implementation, the copy command may be used to as part of the garbage collection process. The copy command may be used instead of the host issuing a read command followed by a write command. If the host issues a read command followed by a write command, the data would be transferred from the memory device to the host as part of the read command response and then transferred from the host back to the memory device as part of the write command. The copy command eliminates these transfers of data between the host and the memory device. The copy command may save processing time and bandwidth that would otherwise be used on a read command followed by a write command.

The copy command operates to copy data from a block of memory on the source memory device to enable that block of memory to be erased as part of the garbage collection process. The copied data is then written to another block of memory on the destination memory device. The controller and more specifically, a channel controller, may work to ensure that the copy commands are executed in order to avoid deadlock situations. The channel controller may copy the data to a buffer, check the error correction codes in the metadata for errors and write the data to the destination memory device. The status of the copy process is communicated to the host.

In one exemplary implementation, the copy command may read the data from the block of memory on the source memory device and, at the same time the data is being read, perform error correction on the data. Thus, error correction is performed as the as the data is being streamed from the source memory location. Any bits in the data that require correcting are corrected and then the corrected data is written to another block of memory on the destination memory device along with re-generated error correction code data. The channel controller may copy the data to a buffer, check the error correction codes in the metadata for errors and write the corrected data to the destination memory device with newly generated ECC codes. The status of the copy process is communicated to the host. The ECC codes related to the copy command may be different from the ECC codes related to the metadata.

In one exemplary implementation, the source memory device and the destination memory device may be the same memory device. For example, the copy command may cause data from one block of memory to be copied to another block of memory on the same memory device.

In another exemplary implementation, the source memory device and the destination memory device may be different memory devices. For example, the copy command may cause data from one block of memory to be copied to another block of memory on a different memory device. The source and destination memory devices may be controlled by the same channel controller. In another exemplary implementation, the source and destination memory devices may be controller by different channel controllers.

Figure 8:
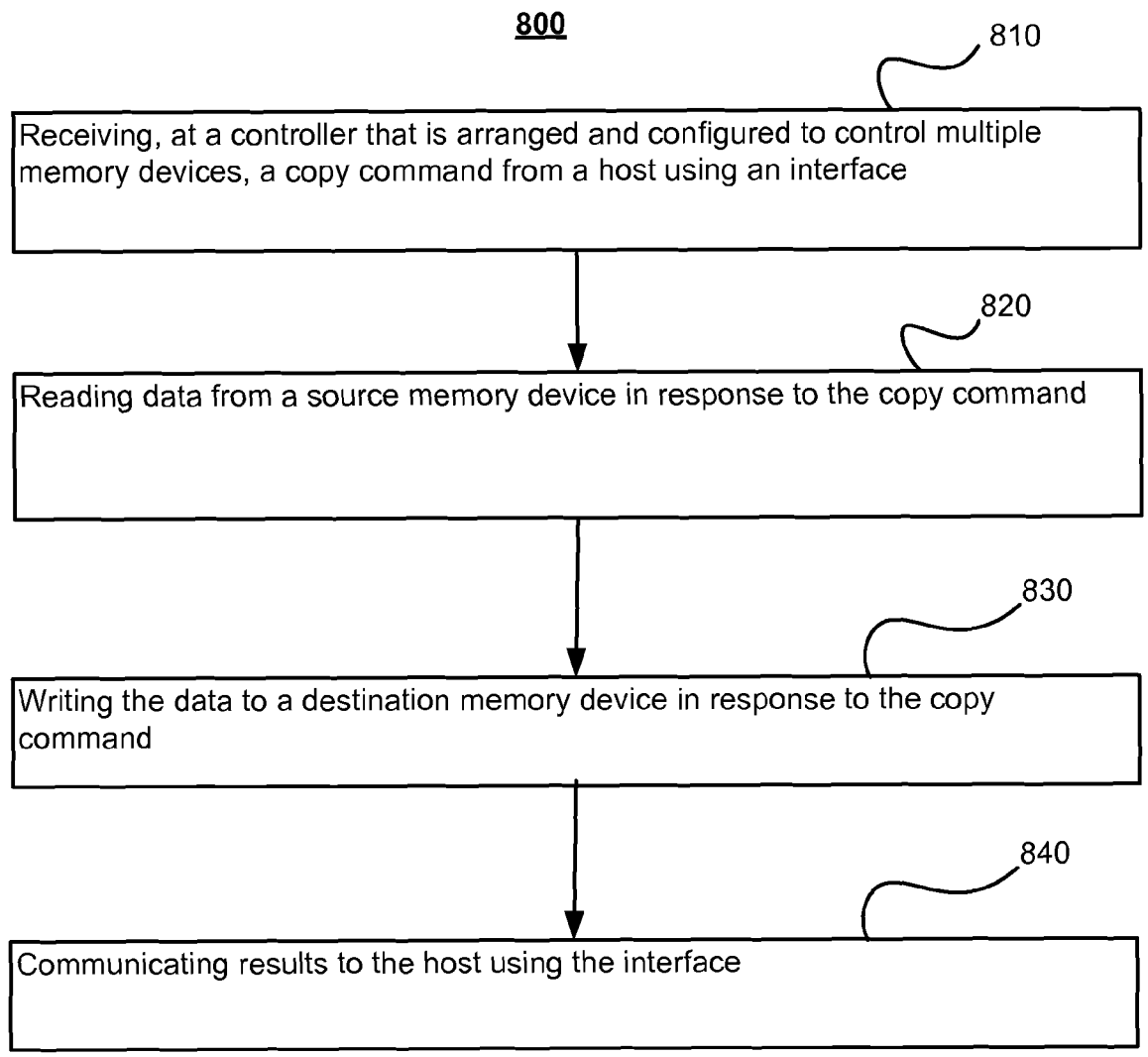
FIG. 8 is an exemplary flowchart illustrating example operations related to a copy command.

Referring to FIG. 8, a process 800 is illustrated for a copy command. The process 800 may include receiving, at a controller, a copy command from a host using an interface (810), reading data from a source memory device in response to the copy command (820), writing the data to a destination memory device in response to the copy command (830) and communicating results to the host using the interface (840).

In another exemplary implementation, the host 106 may communicate a verify on write command to the controller 110. The verify on write command causes the controller to write data to a memory device and then to verify that the data was written correctly to the memory device. In this manner, the host can confirm that the data was written correctly without having to issue a subsequent read command to verify the data.

The controller 110 receives the verify on write command then writes the data to one of the memory devices. As the data is written to the memory device an error correction code is generated and associated with the written data. Then, the controller reads the data from the memory device and checks the ECC. The data is read back without sending the data back to the host. Also, the ECC is checked as the data is being read without having to buffer the data.

If the ECC is correct and there are no errors, then the controller reports back a response to the host indicating that the write was successful. If the ECC is not correct and there are errors, then the host or controller may attempt to re-write the data to the same memory location and/or may attempt to re-write the data to a different memory location and again verify that the data was written correctly.

Figure 9:
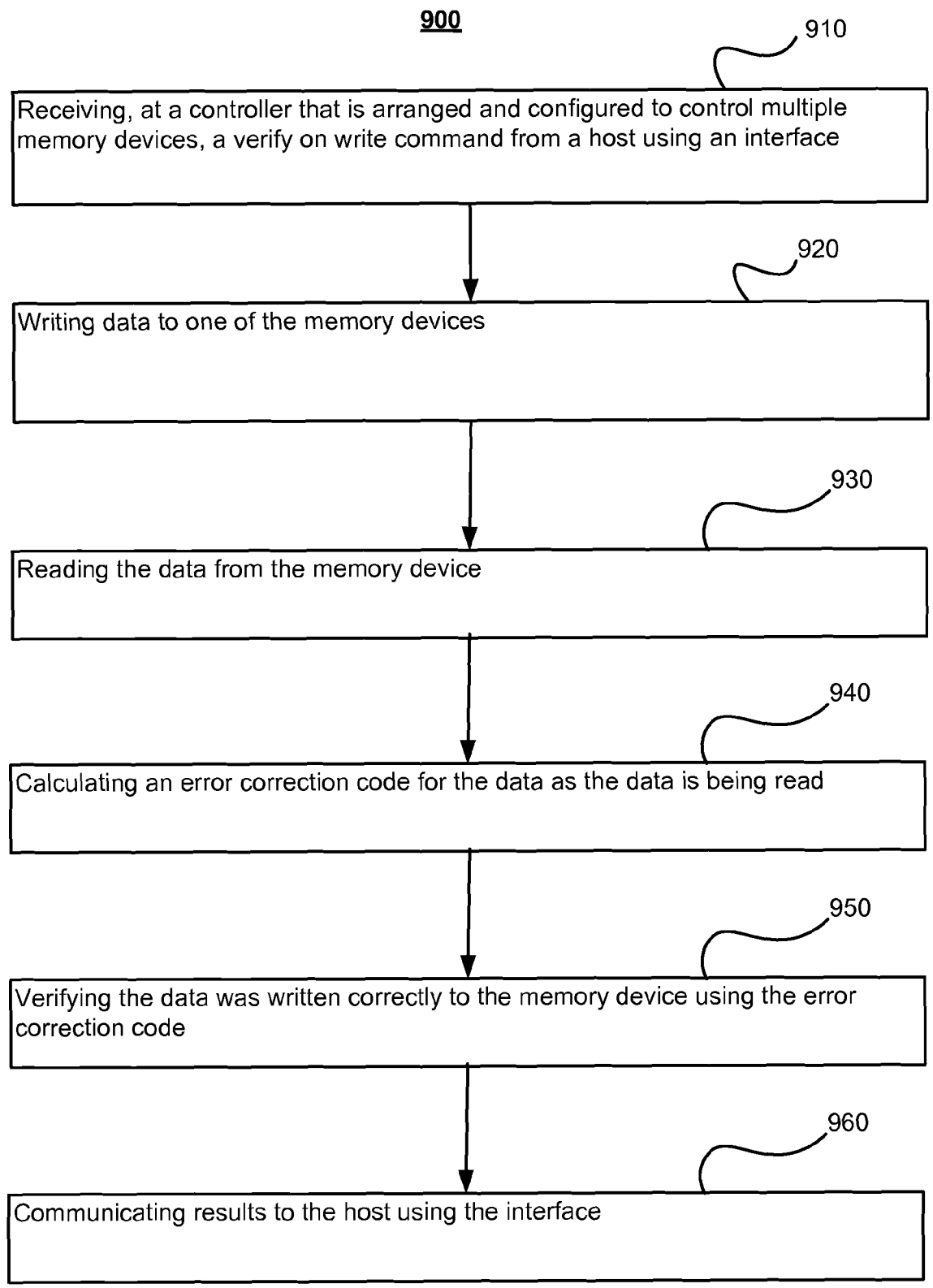
FIG. 9 is an exemplary flowchart illustrating example operation related to a verify on write command.

Referring to FIG. 9, a process 900 is illustrated for a verify on write command. The process 900 may include receiving, at a controller, a verify on write command from a host using an interface (910), writing data to one of the memory devices (920), reading the data from the memory device (930), calculating an error correction code for the data as the data is being read (940), verifying the data was written correctly to the memory device using the error correction code (950) and communicating results to the host using the interface (960).

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A data storage device comprising:
   an interface that is arranged and configured to interface with a host;
   a command bus;
   multiple memory devices that are operably coupled to the command bus; and
   a controller that is operably coupled to the interface and to the command bus, wherein the controller is arranged and configured to:
      receive a single copy command from the host using the interface;
      read data from a source memory device in response to the copy command;
      copy the data to a buffer;
      check for errors in the data on the source memory device when reading the data from the source memory device in response to the copy command;
      correct the errors in the data;
      generate new error correction codes for the corrected data;
      write the corrected data and the new error correction codes to a destination memory device in response to the copy command; and
      communicate results to the host using the interface.

2. The data storage device of claim 1 wherein the source memory device and the destination memory device are a same memory device.

3. The data storage device of claim 1 wherein the source memory device and the destination memory device are different memory devices.

4. The data storage device of claim 1 wherein:
   the controller comprises multiple channel controllers, wherein each channel controller is arranged and configured to control one or more of the memory devices; and
   the source memory device and the destination memory device are controlled by a same channel controller.

5. The data storage device of claim 1 wherein:
   the controller comprises multiple channel controllers, wherein each channel controller is arranged and configured to control one or more of the memory devices; and
   the source memory device and the destination memory device are controlled by different channel controllers.

6. The data storage device of claim 1 wherein the controller is further configured to:
   read metadata from the source memory device; and
   write the metadata to the destination memory device.

7. A non-transitory recordable storage medium having recorded and stored thereon instructions that, when executed, perform the actions of:
   receiving, at a controller that is arranged and configured to control multiple memory devices, a single copy command from a host using an interface;
   reading data from a source memory device in response to the copy command;
   copying the data to a buffer;
   checking for errors in the data on the source memory device when reading the data from the source memory device in response to the copy command;
   correcting the errors in the data;
   generating new error correction codes for the corrected data;
   writing the corrected data and the new error correction codes to a destination memory device in response to the copy command; and
   communicating results to the host using the interface.

8. The non-transitory recordable storage medium of claim 7 wherein the source memory device and the destination memory device are a same memory device.

9. The non-transitory recordable storage medium of claim 7 wherein the source memory device and the destination memory device are different memory devices.

10. The non-transitory recordable storage medium of claim 7 wherein:
the controller comprises multiple channel controllers, wherein each channel controller is arranged and configured to control one or more of the memory devices; and
the source memory device and the destination memory device are controlled by a same channel controller.

11. The non-transitory recordable storage medium of claim 7 wherein:
the controller comprises multiple channel controllers, wherein each channel controller is arranged and configured to control one or more of the memory devices; and
the source memory device and the destination memory device are controlled by different channel controllers.

12. The non-transitory recordable storage medium of claim 7 wherein the instructions that, when executed, further perform the actions of:
reading metadata from the source memory device; and
writing the metadata to the destination memory device.

13. A method, comprising:
receiving, at a controller that is arranged and configured to control multiple memory devices, a single copy command from a host using an interface;
reading data from a source memory device in response to the copy command;
copying the data to a buffer;
checking for errors in the data on the source memory device when reading the data from the source memory device in response to the copy command;
correcting the errors in the data;
generating new error correction codes for the corrected data;
writing the corrected data and the new error correction codes to a destination memory device in response to the copy command; and
communicating results to the host using the interface.

14. The method as in claim 13 wherein the source memory device and the destination memory device are a same memory device.

15. The method as in claim 13 wherein the source memory device and the destination memory device are different memory devices.

16. The method as in claim 13 wherein:
the controller comprises multiple channel controllers, wherein each channel controller is arranged and configured to control one or more of the memory devices; and
the source memory device and the destination memory device are controlled by a same channel controller.

17. The method as in claim 13 wherein:
the controller comprises multiple channel controllers, wherein each channel controller is arranged and configured to control one or more of the memory devices; and
the source memory device and the destination memory device are controlled by different channel controllers.

18. The method as in claim 13 wherein the instructions that, when executed, further perform the actions of:
reading metadata from the source memory device; and
writing the metadata to the destination memory device.

* * * * *